United States Patent [19]

Yamada et al.

[11] Patent Number: 5,073,828
[45] Date of Patent: Dec. 17, 1991

[54] PHOTOELECTRIC CONVERSION DEVICE

[75] Inventors: Katsuhiko Yamada, Atsugi; Katsunori Hatanaka, Yokohama; Toshihiro Saika; Takayuki Ishii, both of Hiratsuka, all of Japan

[73] Assignee: Canon Kabushiki Kaisha, Tokyo, Japan

[21] Appl. No.: 544,068

[22] Filed: Jun. 26, 1990

Related U.S. Application Data

[63] Continuation of Ser. No. 209,960, Jun. 22, 1988, abandoned.

[30] Foreign Application Priority Data

Jun. 26, 1987 [JP] Japan .................................. 62-160510

[51] Int. Cl.$^5$ ............................................. H04M 1/04
[52] U.S. Cl. ................................. 358/482; 358/213.18
[58] Field of Search ................. 358/209, 213.8, 213.17, 358/482, 483

[56] References Cited

U.S. PATENT DOCUMENTS

| | | | |
|---|---|---|---|
| 3,703,669 | 11/1972 | London | 317/235 |
| 3,838,276 | 9/1974 | Mend et al. | 250/211 J |
| 4,591,916 | 5/1986 | Soneda et al. | 358/213.18 |
| 4,679,088 | 7/1987 | Chiyoma et al. | 358/213.18 |

*Primary Examiner*—Edward L. Coles, Sr.
*Attorney, Agent, or Firm*—Fitzpatrick, Cella, Harper & Scinto

[57] ABSTRACT

A photoelectric conversion device comprises plural photoelectric conversion elements arranged in a linear array, plural common lines each connecting at least two of individual output electrodes of the plural photoelectric conversion elements, conductor layers of a constant potential provided in the vicinity of crossing portions of the individual output electrodes and said common lines, and wirings mutually connecting the conductor layers.

14 Claims, 5 Drawing Sheets

PHOTOELECTRIC CONVERSION DEVICE

This application is a continuation of application Ser. No. 209,960 filed June 22, 1988, now abandoned.

BACKGROUND OF THE INVENTION

1. Field of the Invention

The present invention relates to a photoelectric conversion device, and more particularly a photoelectric conversion device adapted for use in an image reading apparatus such as a facsimile apparatus, an image reader, a digital copying machine, an electronic blackboard or the like.

2. Related Background Art

In recent years there have been developed long line sensors having a same-size optical system, as the image conversion device for the facsimile apparatus, the image reader or the like. This is mainly due to the compactization and high density structure of the photoelectric conversion device enabled by the progress in the technology of printed-circuit, wiring boards. In the long image sensor having the same-size optical system, a linear array of photoelectric converting elements is capable of reading an original image in contact therewith, so that the apparatus can be compactized and can achieve a high image reading speed in comparison with the conventional method of reading the original image point by point with a photoelectric converting element and an optical system utilizing lenses In the conventional long line sensor with same-size optical system, the photoelectric converting elements constituting an array are respectively connected to signal processing IC's composed, for example, of switch devices. However, for example in the G3 facsimile format, 1728 photoelectric converting elements are required for A4 size originals are required, therefore many signal processing IC's are required. For this reason, there are required a large number of device mounting steps, and there has not been obtained an apparatus satisfactory in terms of production cost and reliability.

For the purpose of reducing the number of signal processing IC's and the number of steps of board mounting, there has been employed a structure utilizing matrix wirings. FIG. 1 shows a photoelectric conversion device utilizing such matrix wirings, wherein there are shown a photoelectric conversion device 1 consisting of a linear array of plural photoelectric conversion elements; a scanning unit 2; a signal processing unit 3; and matrix wirings 4. Among the wirings connecting the scanning unit 2 and the signal processing unit 3, vertical ones constitute individual electrodes while horizontal one constitute common lines.

In such a matrix wiring, the individual electrodes and common lines are inevitably close in order to compactize the matrix wiring. Consequently floating capacitances are present between the wirings, thus generating crosstalk among the output signals, and deteriorating the obtained image signals This drawback can be most simply resolved by increasing the distances between the wirings. However, such solution increases the dimension of the matrix wiring, and is not desirable for a device requiring a large number of photoelectric conversion elements as explained before.

There has also been proposed a photoelectric conversion device in which a conductor layer and a wiring capable of maintaining a constant potential at each crossing point of the individual electrode and the common line, thereby controlling the floating capacity between the individual electrodes and the common lines and preventing the crosstalk of the output signals released through such floating capacitances.

FIG. 2A is a plan view of matrix wiring in which a conductor layer of a constant potential is formed at the insulated crossing point of the individual electrode and the common line, while FIG. 2B is a cross-sectional view along a line B—B' of the matrix wiring shown in FIG. 2A. In FIGS. 2A and 2B there are shown individual electrodes 301–304; common lines 305–308; intermediate lines 309–313 positioned in the spaces of the common lines 305–308; a conductor layer 314 positioned between the individual electrodes 301–304 and the common lines 305–308 in the insulated crossing points thereof and is connected to an unrepresented power source capable of maintaining a constant potential; and contact holes 315 for ohmic contact of the individual electrodes 301–304 and the common lines 305–308.

However the photoelectric conversion device with such matrix wiring having a conductor layer of a constant potential in the insulated crossing points of the individual electrodes and the common lines have been associated with the following drawbacks.

In such matrix wiring, there is provided a conductor layer of a constant potential in the insulated crossing points of the individual electrodes and the common lines for reducing the capacitances therebetween.

Though such structure can reduce the floating capacitances between the individual electrodes and the common lines, new floating capacitances are formed between the conductor layer of constant potential and the individual electrodes and between said conductor layer and the common lines.

The floating capacitances are generated between the conductor layer of constant potential and all the individual electrodes and between said conductor layer and all the common lines because the conductor layer is extended over the entire area of the matrix wiring, and are practically not negligible.

FIG. 3 is an equivalent circuit of an accumulating photoelectric conversion device employing said conductor layer of constant potential. In this drawing, 501 denotes a photoelectric conversion unit. 503 denotes a storage capacitor. 502 denotes a switch unit. 505 denotes a load capacitor. 506 denotes a signal output terminal unit. If the above-explained matrix wiring is employed in the output side of the accumulating photoelectric conversion circuit shown in FIG. 3, a floating capacitance 504 not negligible in comparison with the load capacitor 505 which may deteriorate the efficiency of charge transfer.

SUMMARY OF THE INVENTION

In consideration of the foregoing, the object of the present invention is to provide a photoelectric conversion device equipped with matrix wiring capable of suppressing the crosstalks among the output signals and also suppressing the floating capacitances resulting from a structure for suppressing said cross-talks.

The photoelectric conversion device of the present invention is featured by a structure provided with plural photoelectric conversion elements arranged in a linear array; plural common lines each connecting in common at least two of the individual output electrodes of said plural photoelectric conversion elements; conductor layers of a constant potential positioned in the vicinity of crossing points of said individual output electrodes and said common lines; and wirings mutually connecting said conductor layers.

The principal feature of the present invention is the presence of a conductor layer of a constant potential in the vicinity of the crossing point of the individual output electrode and the common line. The conductor layer is maintained at a constant potential for example by connection to a constant voltage source.

The present invention is capable of suppressing the floating capacitance formed at the insulated crossing point of the individual output electrode and the common line, and also suppressing the floating capacitances between said conductor layer of constant potential and the individual electrode and between said conductor layer and the common line.

As the conductor layer provided at the insulated crossing point of the individual output electrode and the common line is maintained at a constant potential, the potential difference between the individual output electrode and the conductor layer is made independent from the potential difference between the common line and the conductor layer Consequently the change in potential or current in the individual output electrodes does not influence the common line since the conductor layer positioned between is maintained at a constant potential despite of such change. Similarly the change in the potential or current in the common line does not affect the individual output electrode. In this manner the influence of the floating capacitance between the individual output electrode and the common line can be suppressed.

Outside the crossing area of the individual output electrode and the common line, the conductor layer is eliminated except the wirings therefor to reduce the crossing area between the conductor layers of constant potential and the individual output electrodes and between said conductor layers and the common lines, thereby reducing the newly generated capacitances and preventing the deterioration of the transfer efficiency.

BRIEF DESCRIPTION OF THE DRAWINGS

FIG. 4A shows a plan view thereof, FIG. 4B shows a cross-sectional view along line X—X' in FIG. 4A, and FIG. 4C show a sectional view along line Y—Y' in FIG. 4A;

DETAILED DESCRIPTION OF THE PREFERRED EMBODIMENTS

With reference to the accompanying drawings, the embodiments of the present invention are explained as follows.

Figure 4A:
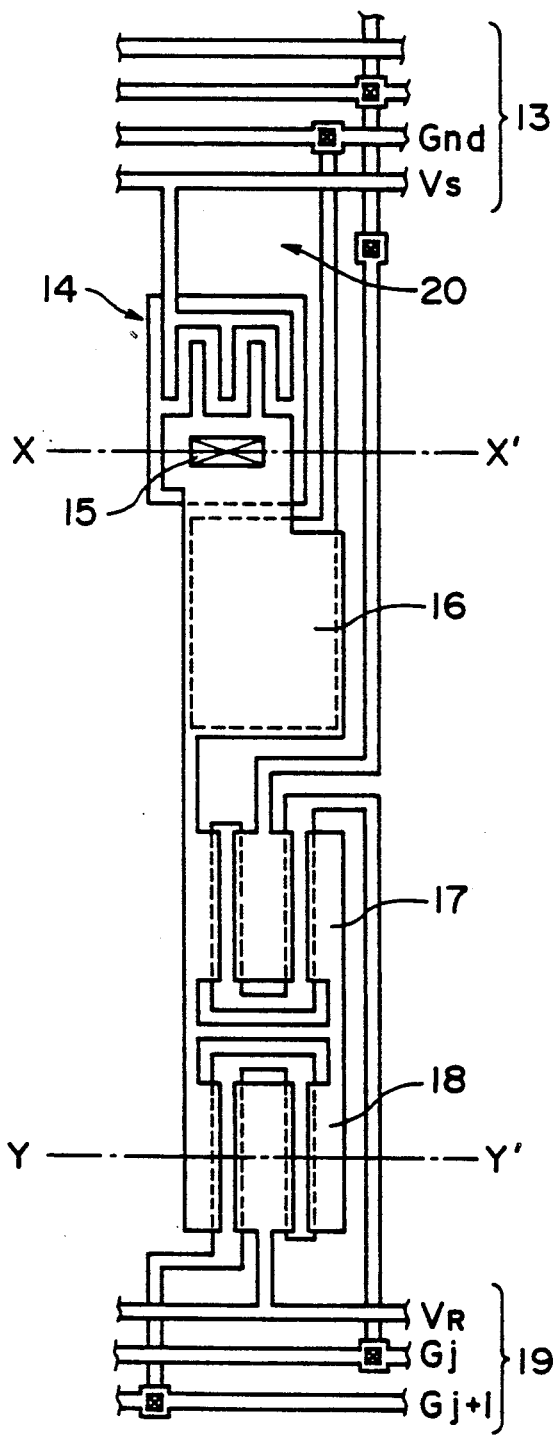
FIGS. 4A-C shows illustratively a photoelectric conversion device according to the present invention.
Figure 4B:
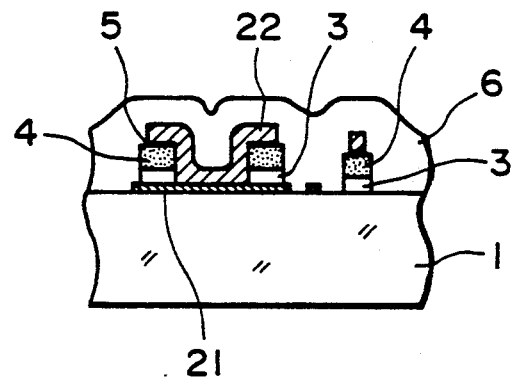
Figure 4C:
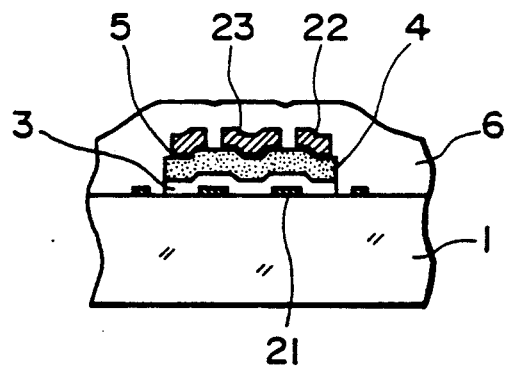

FIGS. 4A-C illustratively shows a portion corresponding to 1-bit of the photoelectric conversion device according to the present invention. FIG. 4A shows plan view. FIG. 4B shows a sectional view along line X—X' in FIG. 4A. FIG. 4C shows a sectional view along line Y—Y' in FIG. 4A. FIG. 4A shows only upper and lower wiring pattern and contact hole unit, for the purpose of prevention of complex illustration.

In FIG. 4A, 13 denotes a signal line matrix unit 14 denotes a photoelectric conversion unit, 15 denotes a contact hole for connection between gate and source, 16 denotes a storage capacitor; 17 denotes a transfer TFT; 18 denotes reset TFT. 19 denotes a wiring unit of gate driving line. In the embodiment, so called lensless structure directly contacting an original to read it is used. Accordingly, a window 20 for illuminating the original is provided Further, a lower gate electrode of the senser unit is made of opaque material for use as a light shielding film.

Referring to FIGS. 4B and 4C, a substrate 1, is made of a material such as glass. Lower electrode 21 is a gate electrode of the sensor in FIG. 4B and is a gate electrode of TFT in FIG. 4C.

An insulating layer 3 is made of SiNxH, SiO$_2$ or the like.

A photoconducting semiconductor layer 4 is made of a-Si:H or the like.

An n+ layer 5 is provided for ohmic contact to the upper electrode. Upper electrode 22 is a source electrode of sensor unit in FIG. 4B, and upper electrode 23 is source drain electrode of TFT in FIG. 4C. Element 6 denotes an insulating layer.

The photoelectric conversion device of the present invention is produced by using, as a photoconductive semiconductor material, a-Si:H film formed by a glow discharge process to provide on a common substrate TFT type photoelectric conversion portion, the storage capacitor, the transfer and reset TFT, and the matrix wiring portion as a stacked layer structure comprising a lower electrode, SiNH insulating layer, a-Si:H layer, n+ layer and upper electrode, in a single process simultaneously.

Figure 5A:
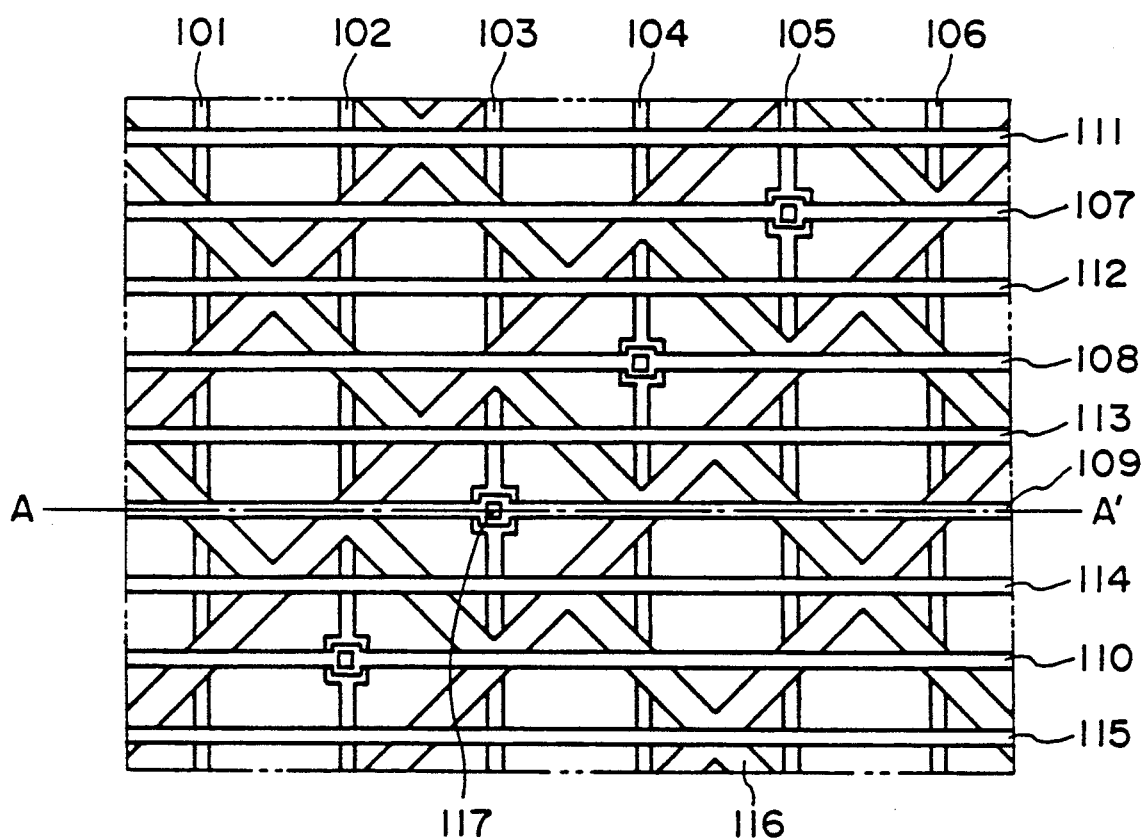
FIG. 5A is a plan view of matrix wiring embodying the present invention.
Figure 5B:
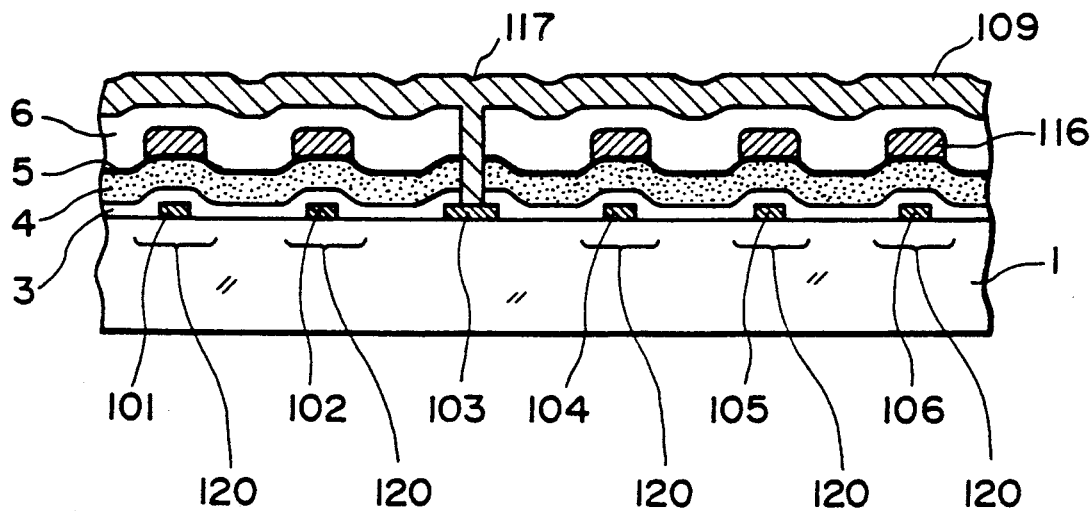
FIG. 5B is a cross-sectional view along a line A—A' in FIG. 5A.
Figure 6A:
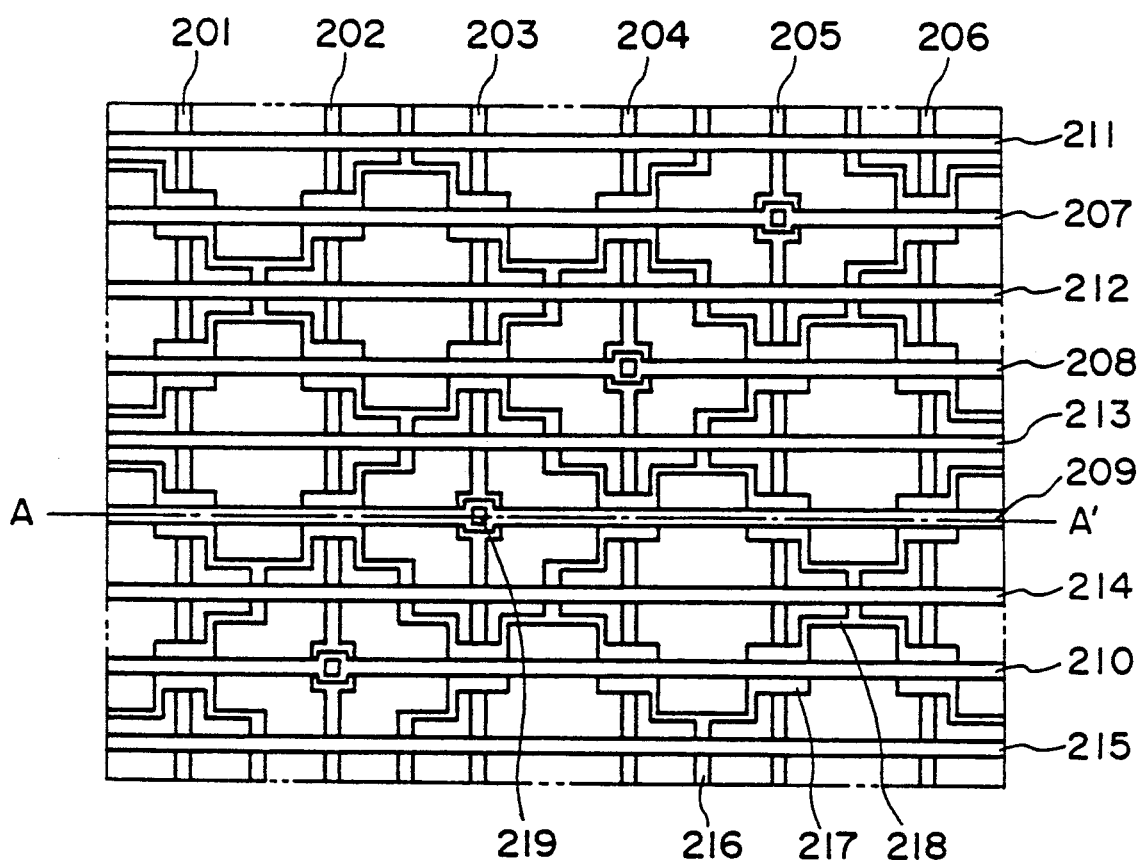
FIG. 6A is a plan view of matrix wiring constituting another embodiment of the present invention.
Figure 6B:
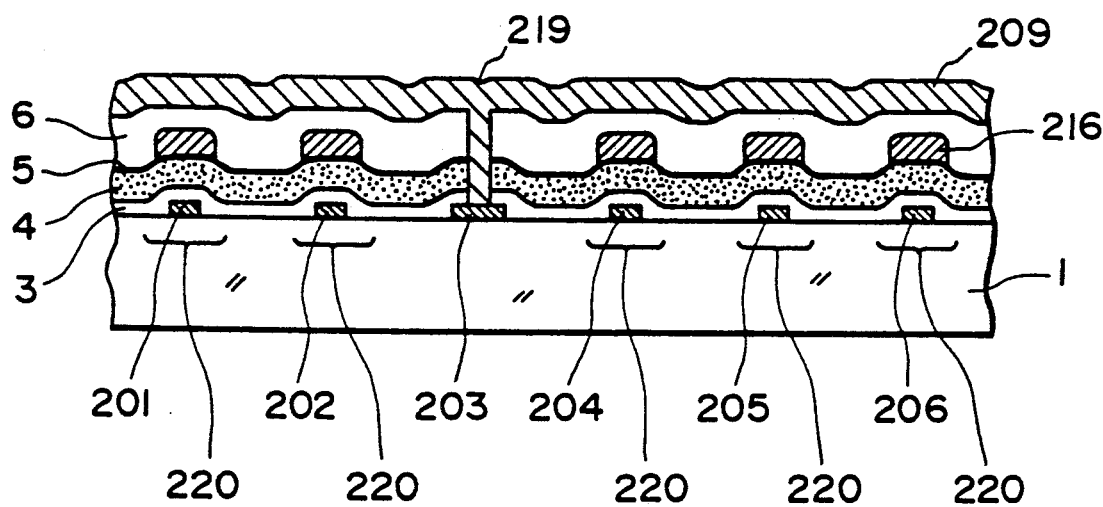
FIG. 6B is a cross-sectional view along a line A—A' in FIG. 6A.

FIGS. 5A and 6A are schematic plan views of matrix wiring embodying the present invention, and FIGS. 5B and 6B are cross-sectional views respectively along lines A—A' in FIGS. 5A and 6A.

In FIGS. 5A, 5B, 6A and 6B there are shown individual electrodes 101-106, 201-206 at the lowermost position; common lines 107-110, 207-210 at the uppermost position; intermediate lines 111-115, 211-215 positioned between the common lines at the uppermost position; and conductor layers and wirings connecting said conductor layers 116, 216 positioned between the individual electrodes at the lowermost position and the common lines at the uppermost position and connected to a power source (not shown) capable of maintaining a constant potential.

In FIG. 6A there are shown conductor layers 217 of constant potential, and wirings 218 connecting said conductor layers.

In the structure shown in FIG. 5A, the conductor layers and the wirings therefor are integrally constructed.

In the embodiments shown in FIGS. 5A, 5B, 6A and 6B, the conductor layers of constant potential exist only in the vicinity 120, 220 of the crossing points of the individual electrodes at the lowermost position and the common lines in the uppermost position, as shown in the cross sectional views in FIGS. 5B and 6B. In this manner it is rendered possible to suppress the floating capacitances between said individual electrodes and said common lines, thereby preventing the crosstalks among the output signals.

Also as shown in the plan views in FIGS. 5A and 6A, the crossing areas between the wirings for connecting the conductor layers of constant potential and said individual electrodes or said common lines are reduced to suppress the floating capacitances in comparison with the conventional matrix wiring, thereby preventing the deterioration of the transfer efficiency.

The photoelectric conversion device of the present invention may be prepared by any known process.

As explained in the foregoing, these embodiments provide a photoelectric conversion device with compact matrix wiring capable of suppressing the crosstalk among the output signals, and also suppressing the formation of floating capacitances in the structure for suppressing said crosstalks, thereby preventing the deterioration of the transfer efficiency.

What is claimed is:

1. A photoelectric conversion device comprising:
plural photoelectric conversion elements arranged in a linear array, wherein each of the photoelectric conversion elements has an individual output electrode;
plural common lines each connecting at least two of said individual output electrodes of said plural photoelectric conversion elements;
a conductor layer provided at least at an unconnected cross-over point between said individual output electrodes and said common lines; and
wirings connecting said conductor layer to other conductor layers.

2. A photoelectric conversion device comprising:
a plurality of photoelectric conversion elements;
a matrix wiring section, comprising a plurality of common lines, for deriving an electric signal from said photoelectric conversion elements, wherein said matrix wiring section has a respective individual electrode provided for each of said photoelectric conversion elements, wherein an insulating layer is disposed between said plurality of common lines and said individual electrodes, and wherein said common lines are each electrically connected to a respective set of said individual electrodes, each said set including at least one of said individual electrodes;
at least one conductor layer provided in a vicinity of a portion where one of said individual electrodes crosses one of said common lines, said conductor layer being electrically insulated from both said individual electrodes and said common lines; and
a wiring for providing said conductor layer with a predetermined potential.

3. A device according to claim 2, wherein said wiring electrically connects said conductor layers to each other.

4. A device according to claim 2, further comprising intervening wiring between at least two of said common lines.

5. A device according to claim 2, further comprising intervening wirings provided between said common lines, wherein said intervening wirings are insulated from said individual electrodes, said common lines, said conductor layer, and said wiring for providing said conductor with the predetermined potential.

6. A device according to claim 2, wherein said individual electrodes are formed in an elongated arrangement over portions where said individual electrodes are electrically connected with said common lines.

7. A device according to claim 2, wherein said conductor layer is provided between said individual electrodes and said common lines.

8. A reading apparatus comprising:
a photoelectric conversion device further comprising:
a plurality of photoelectric conversion elements,
a matrix wiring section, comprising a plurality of common lines, for deriving electric signals from said photoelectric conversion elements, and having respective individual electrodes provided for each of said photoelectric conversion elements, wherein an insulating layer is disposed between said plurality of common lines and said individual electrodes, and wherein said common lines are each electrically connected to a respective set of said individual electrodes, each said set including at least one of said individual electrodes, and
at least one conductive layer provided only in a vicinity of a portion where one of said individual electrodes crosses one of said common lines, wherein said conductive layer is electrically insulated from said individual electrodes and said common lines, and
a wiring for providing said conductive layer with a desired potential;
a circuit for driving said photoelectric conversion device; and
a source for providing the desired potential.

9. An apparatus according to claim 8, wherein said wiring electrically connects said conductive layers to each other.

10. An apparatus according to claim 8, further comprising an intervening wiring between at least two of said common lines.

11. An apparatus according to claim 8, further comprising intervening wiring provided between said common lines, wherein said intervening wiring is insulated from said individual electrodes, said common lines, said conductive layer, and said wiring for providing the predetermined potential.

12. An apparatus according to claim 8, wherein said individual electrodes are formed in an elongated arrangement over portions where said individual electrodes are electrically connected with said common lines.

13. An apparatus according to claim 8, wherein said conductive layer is provided between said individual electrodes and said common lines.

14. An apparatus according to claim 8, wherein the predetermined potential is constant.

* * * * *

UNITED STATES PATENT AND TRADEMARK OFFICE
CERTIFICATE OF CORRECTION

PATENT NO. : 5,073,828
DATED : December 17, 1991
INVENTOR(S) : KATSUHIKO YAMADA, ET AL.

It is certified that error appears in the above-identified patent and that said Letters Patent is hereby corrected as shown below:

SHEET 1 OF 5

Figure 1:
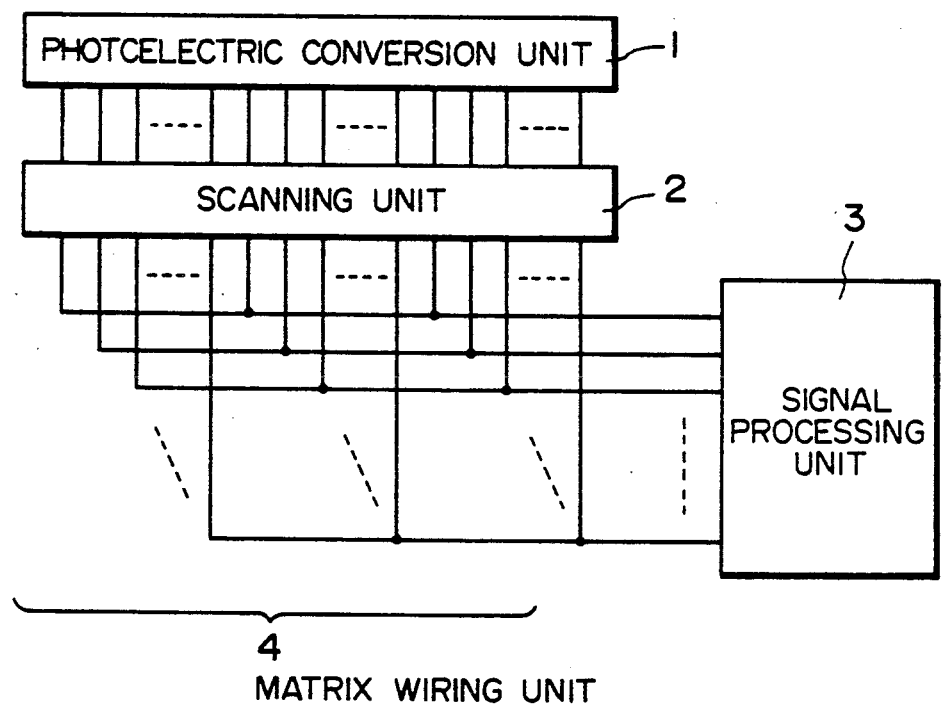
FIG. 1 is a block diagram of a photoelectric conversion device with matrix wiring.
Figure 2A:
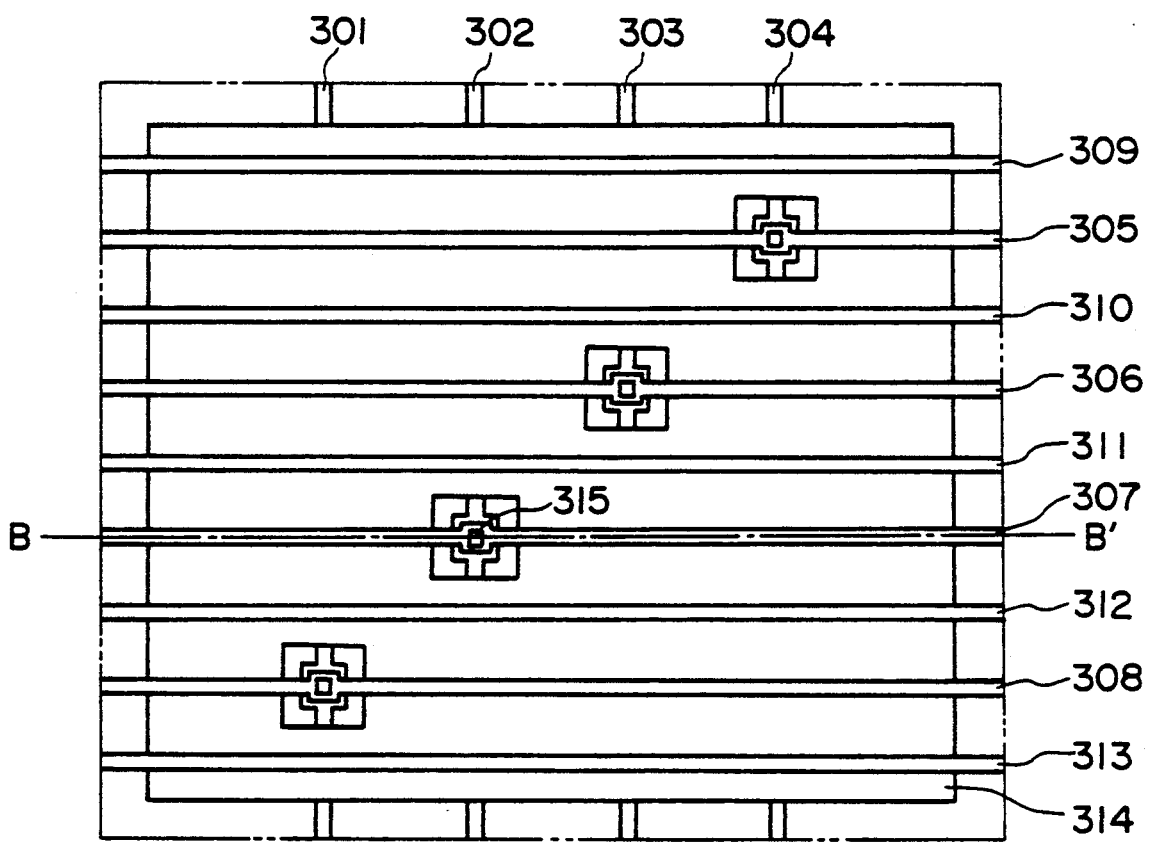
FIG. 2A is a plan view of conventional matrix wiring.
Figure 2B:
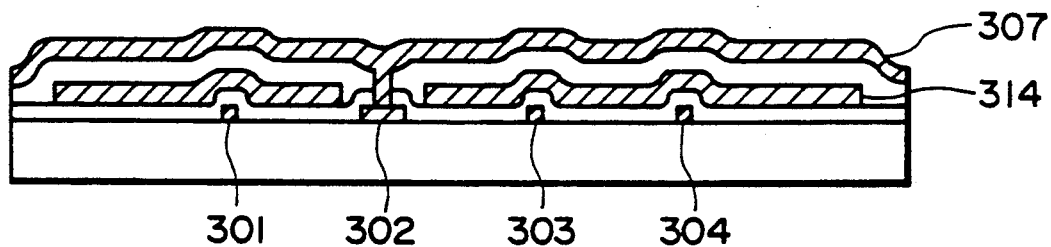
FIG. 2B is a cross-sectional view along a line B—B' in FIG. 2A.
Figure 3:
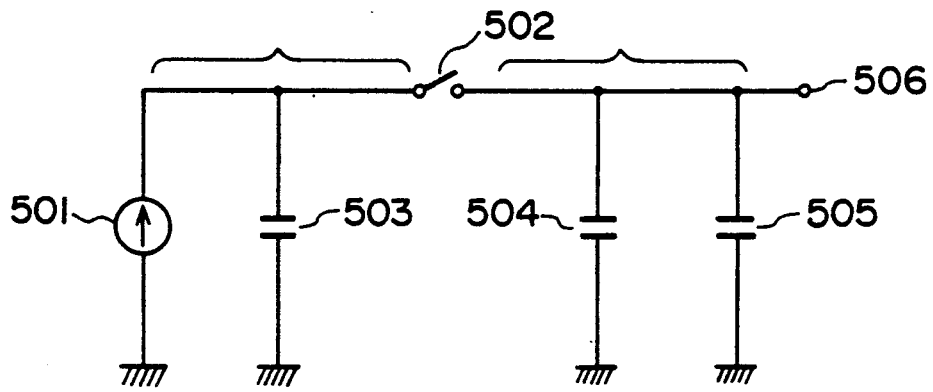
FIG. 3 is an equivalent circuit diagram of an accumulating photoelectric conversion device with conventional matrix wiring.

FIG. 1, "PHOTCELECTRIC" should read --PHOTOELECTRIC--.

COLUMN 1

Line 22, "printed-circuit," should read --printed-circuit--.
Line 37, "are required," should read --,--.
Line 59, "signals" should read --signals.--.

COLUMN 2

Line 16, "thereof and is" should read --thereof, which are--.
Line 23, "have" should read --has--.

COLUMN 3

Line 24, "layer" should read --layer.--.
Line 28, "of" should be deleted.
Line 54, "shows" should read --show--.
Line 58, "show" should read --shows--.

COLUMN 4

Line 7, "shows" should read --show--.
Line 9, "plan" should read --a plan--.
Line 15, "unit" should read --unit;--.
Line 16, "unit," should read --unit;--.
Line 17, "source," should read --source;--.
Line 19, "TFT." should read --TFT; and--.

UNITED STATES PATENT AND TRADEMARK OFFICE
CERTIFICATE OF CORRECTION

PATENT NO. : 5,073,828
DATED : December 17, 1991
INVENTOR(S) : KATSUHIKO YAMADA, ET AL.

Page 2 of 2

It is certified that error appears in the above-identified patent and that said Letters Patent is hereby corrected as shown below:

COLUMN 4

Line 24, "provided" should read --provided.--.
Line 25, "senser" should read --sensor--.
Line 27, "substrate 1," should read --substrate 1--.

Signed and Sealed this

Thirteenth Day of July, 1993

Attest:

MICHAEL K. KIRK

Attesting Officer  Acting Commissioner of Patents and Trademarks